(12) United States Patent
Yamashita et al.

(10) Patent No.: US 6,662,132 B2
(45) Date of Patent: Dec. 9, 2003

(54) NOISE ANALYZING METHOD AND APPARATUS AND STORAGE MEDIUM

(75) Inventors: Yasuhiro Yamashita, Kawasaki (JP); Shogo Fujimori, Kawasaki (JP); Ryoji Yamada, Kawasaki (JP); Kazuhiko Tokuda, Kawasaki (JP); Makoto Suwada, Kawasaki (JP); Masaki Tosaka, Kawasaki (JP); Jiro Yoneda, Kawasaki (JP); Yoshiyuki Iwakura, Yokohama (JP); Kazunari Gotou, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 222 days.

(21) Appl. No.: 09/733,076

(22) Filed: Dec. 11, 2000

(65) Prior Publication Data

US 2002/0007253 A1 Jan. 17, 2002

(30) Foreign Application Priority Data

Jun. 5, 2000 (JP) ........................................ 2000-167647

(51) Int. Cl.[7] .............................................. G06F 17/50
(52) U.S. Cl. ........................ 702/111; 702/117; 702/118; 702/119; 702/123; 702/191
(58) Field of Search ................................ 702/111, 117, 702/118, 119, 123, 191; 703/13, 14, 15, 16, 19; 716/1–21

(56) References Cited

U.S. PATENT DOCUMENTS

| 4,831,497 A | * | 5/1989 | Webster et al. ............. 361/774 |
| 5,481,695 A | * | 1/1996 | Purks ........................... 703/15 |
| 5,568,395 A | * | 10/1996 | Huang ............................ 716/4 |
| 5,751,597 A | * | 5/1998 | Okano et al. .................... 716/5 |
| 5,867,810 A | * | 2/1999 | Miura et al. ................. 702/191 |
| 5,933,799 A | * | 8/1999 | Kamiya ...................... 702/191 |
| 5,943,637 A | * | 8/1999 | Okumura et al. ........... 702/111 |
| 5,983,006 A | * | 11/1999 | Carlson et al. ................. 716/4 |
| 6,028,989 A | * | 2/2000 | Dansky et al. ................. 716/8 |
| 6,128,769 A | * | 10/2000 | Carlson et al. ................ 716/6 |
| 6,378,109 B1 | * | 4/2002 | Young et al. ................... 716/4 |
| 6,405,350 B1 | * | 6/2002 | Tawada .......................... 716/5 |

* cited by examiner

*Primary Examiner*—Marc S. Hoff
*Assistant Examiner*—Carol S W Tsai
(74) *Attorney, Agent, or Firm*—Staas & Halsey LLP

(57) ABSTRACT

A noise analyzing method analyzes a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction.

15 Claims, 12 Drawing Sheets

NOISE ANALYZING METHOD AND APPARATUS AND STORAGE MEDIUM

BACKGROUND OF THE INVENTION

This application claims the benefit of a Japanese Patent Application No. 2000-167647 filed Jun. 5, 2000, in the Japanese Patent Office, the disclosure of which is hereby incorporated by reference.

1. Field of the Invention

The present invention generally relates to noise analyzing methods and apparatuses and storage media, and more particularly to a noise analyzing method for analyzing noise which may be generated in an electronic circuit when designing the electronic circuit such as a large scale integrated (LSI) circuit, multi-chip module (MCM) and printed circuit board (PCB) by a computer aided design (CAD), and to a noise analyzing apparatus which analyzes the noise by such a noise analyzing method, and to a computer-readable storage medium which stores a program for causing a computer to carry out such a noise analysis.

Recently, noise analysis has become important when designing an electronic circuit, particularly because the size of electronic circuits has decreased considerably and the operation speed of the electronic circuits has increased greatly. Accordingly, there are demands to accurately and quickly analyze the noise which is generated in the electronic circuit, when designing the electronic circuit.

2. Description of the Related Art

Conventionally, various kinds of noise analyzing tools have been proposed to carry out the noise analysis when designing the electronic circuit. The noise analyzing tool carries out the noise analysis and a noise check using a circuit simulator after an assemble design of the electronic circuit is made, so as to determine noise countermeasures for suppressing the noise. The design of the electronic circuit is modified if necessary based on the determined noise countermeasures. After such a design modification, the noise analysis and the noise check are carried out again, and the above described procedure is repeated until the noise falls within a tolerable range.

The noise which is to be mainly considered when designing the electronic circuit includes reflection noise and crosstalk noise. Normally, the reflection noise is generated by a mismatch of an internal resistance of a driver and a characteristic impedance of a transmission line. On the other hand, the crosstalk noise greatly depends on signal transmitting directions, driving capacity of the driver, a gap between adjacent patterns, and the like. Usually, the crosstalk analysis requires information related to the adjacent patterns, and for this reason, the noise analysis and the noise check are carried out after the assemble design of the electronic circuit is made, using design data. The information related to the adjacent patterns include a pattern gap, a distance for which the patterns run parallel to each other, a position where the patterns are parallel on the transmission lines, and the like.

However, as will be described hereunder, the conventional noise analyzing method does not specify a signal transmitting direction when carrying out the noise analysis of a bus.

FIG. 1 is a diagram for explaining the noise analysis for a case where three bidirectional nets exist. A net refers to a portion which is made up of at least one target circuit element when designing the electronic circuit. For example, when observing a transmission signal waveform between a driver/receiver C and a receiver/driver D (hereinafter referred to as an interval C-D), it is necessary to take into consideration the crosstalk noise of the adjacent nets, that is, a transmission signal waveform between a driver/receiver A and a receiver/driver B (hereinafter referred to as an interval A-B) and a transmission signal waveform between a driver/receiver E and a receiver/driver F (hereinafter referred to as an interval E-F).

In this case, with respect to a transmitting direction C→D indicated by ①, it is necessary to analyze the crosstalk noise for the interval A-B by taking into consideration a transmitting direction A→B and a transmitting direction B→A. In addition, with respect to a transmitting direction D→C indicated by ②, it is necessary to analyze the crosstalk noise for the interval A-B by taking into consideration the transmitting direction A→B and the transmitting direction B→A. Similarly, it is necessary to analyze the crosstalk noise for the interval E-F by taking into consideration a transmitting direction E→F and the transmitting direction F→E.

For this reason, it takes an extremely long time to carry out the noise analysis when a large number of adjacent wirings exist. Moreover, the transmitting directions such as B→A and F→E are opposite to the transmitting direction C→D, and the crosstalk noise caused by such a transmission in the opposite direction is particularly large.

For example, if the transmitting direction is always the same between the interval C-D and the interval E-F, the transmitting direction F→E does not exist with respect to the transmitting direction C→D. In this case, it is unnecessary and useless to carry out the noise analysis in the transmitting direction F→E. Such an unnecessary noise analysis not only increases the noise analyzing time, but would obtain an erroneous noise analysis result which indicates that the noise generated is much larger than the crosstalk noise which is would actually be generated.

In other words, because the conventional noise analyzing method does not specify the signal transmitting direction when carrying out the noise analysis of the bus, there was a problem in that the noise analysis is also carried out for combinations of signals which are actually not transmitted, when analyzing the crosstalk of bidirectional signals. Consequently, the conventional noise analyzing method carries out an unnecessary noise analysis, the noise analyzing time is considerably increased thereby. In addition, the conventional noise analyzing method obtains an erroneous noise analysis result which indicates that the noise generated is much larger than the crosstalk noise which is would actually be generated.

SUMMARY OF THE INVENTION

Accordingly, it is a general object of the present invention to provide a novel and useful noise analyzing method and apparatus and computer-readable storage medium, in which the problems described above are eliminated.

Another and more specific object of the present invention is to provide a noise analyzing method and apparatus and computer-readable storage medium, which can reduce a noise analyzing time and obtain an accurate noise analysis result, by preventing an unnecessary noise analysis to be carried out for combinations of signals which are actually not transmitted.

Still another object of the present invention is to provide a noise analyzing method comprising analyzing a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction. According to the noise analyzing method of the present invention, it is possible to reduce a noise analyzing time and obtain an accurate noise analysis result, by preventing an unnecessary noise analysis to be carried out for combinations of signals which are actually not transmitted.

A further object of the present invention is to provide a noise analyzing apparatus comprising an analyzing section analyzing a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction. According to the noise analyzing apparatus of the present invention, it is possible to reduce a noise analyzing time and obtain an accurate noise analysis result, by preventing an unnecessary noise analysis to be carried out for combinations of signals which are actually not transmitted.

Another object of the present invention is to provide a computer-readable storage medium which stores a program for causing a computer to carry out a noise analyzing process, where the program comprises the procedure of causing the computer to analyze a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction. According to the computer-readable storage medium of the present invention, it is possible to reduce a noise analyzing time and obtain an accurate noise analysis result, by preventing an unnecessary noise analysis to be carried out for combinations of signals which are actually not transmitted.

Other objects and further features of the present invention will be apparent from the following detailed description when read in conjunction with the accompanying drawings.

BRIEF DESCRIPTION OF THE DRAWINGS

FIG. 5 is a diagram for explaining a bus group and driver/receiver groups spanning a plurality of LSIs, PCBs, MCMs and the like;

DESCRIPTION OF THE PREFERRED EMBODIMENTS

Figure 1:
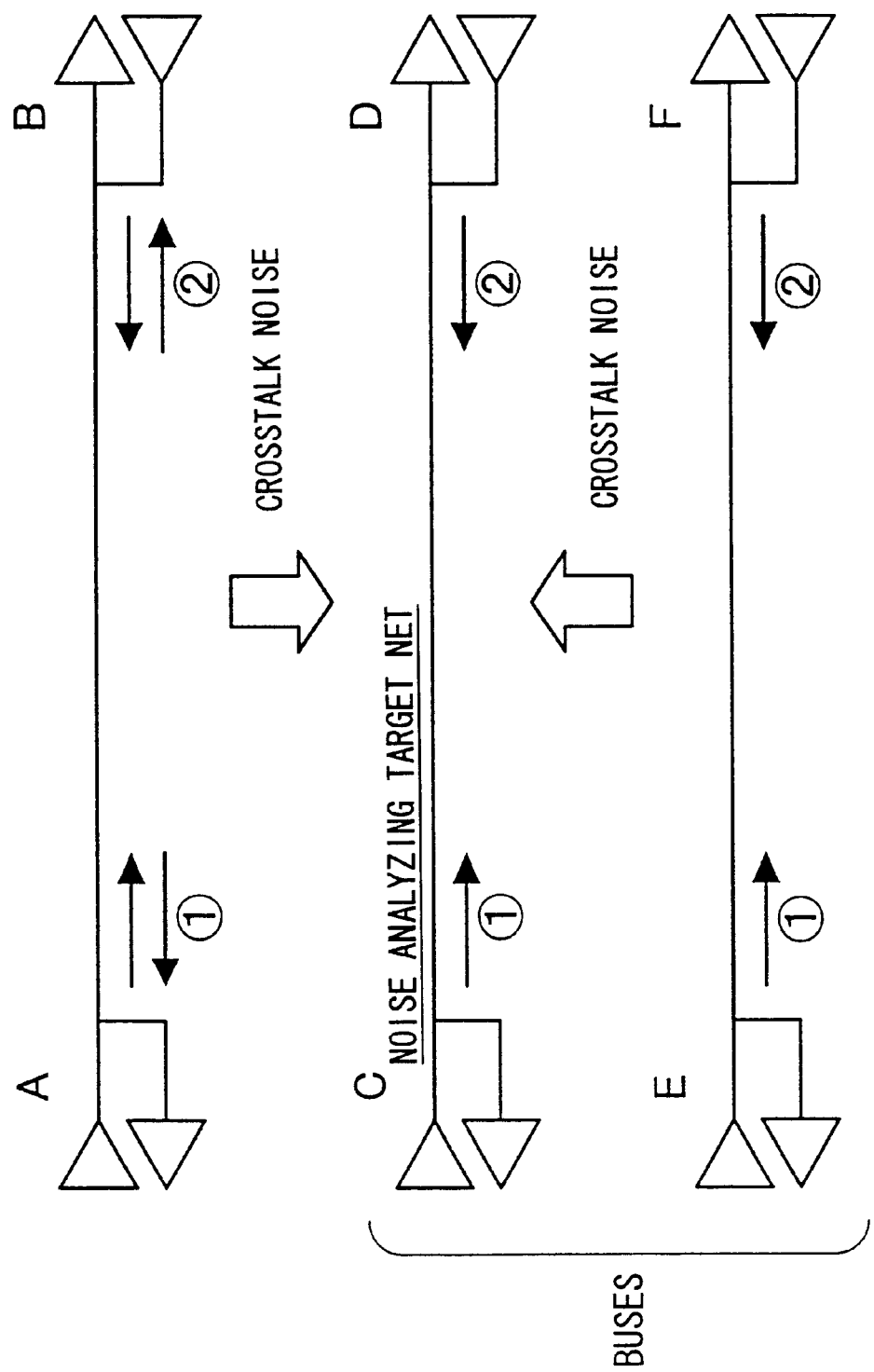
FIG. 1 is a diagram for explaining a noise analysis for a case where three bidirectional nets exist.

A description will be given of various embodiments of a noise analyzing method, a noise analyzing apparatus and a computer-readable storage medium according to the present invention, by referring to the drawings.

Figure 2:
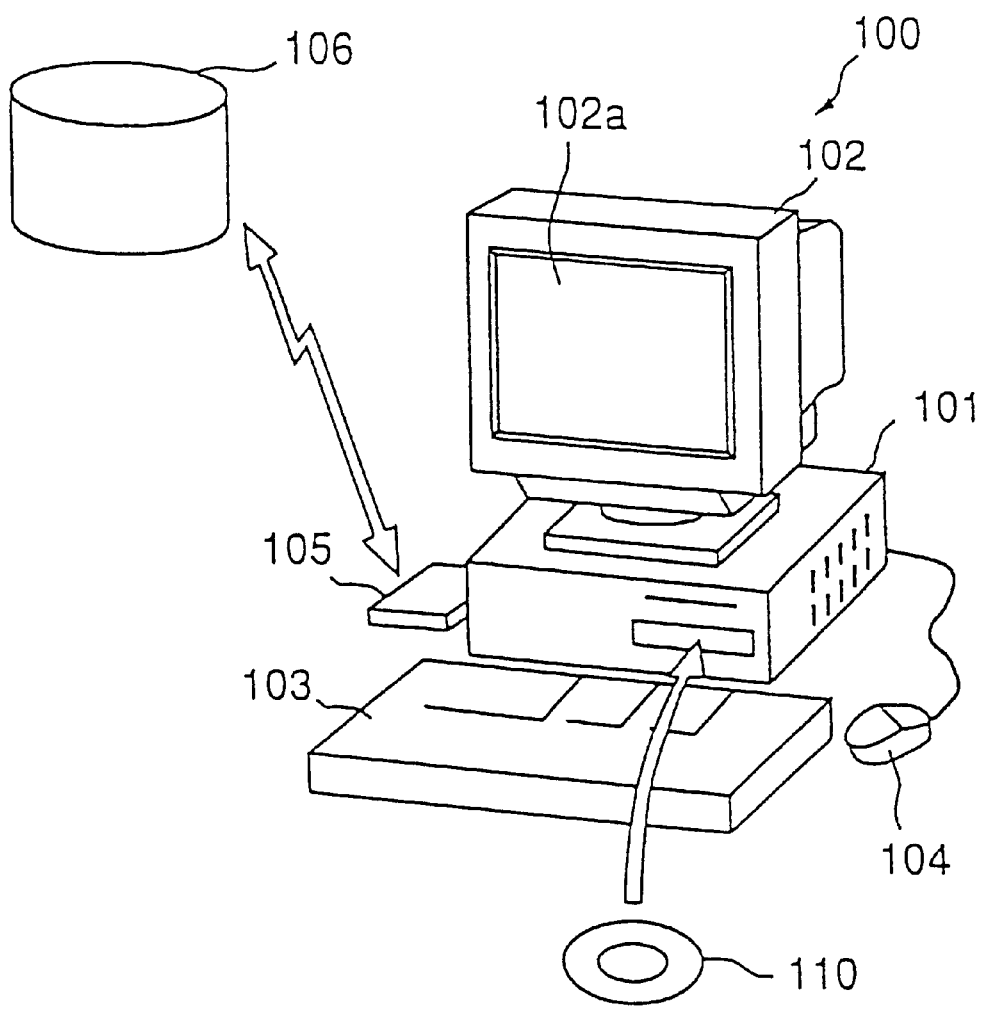
FIG. 2 is a perspective view showing a computer system to which the present invention is applied in an embodiment of the present invention.

First, a description will be given of an embodiment of the noise analyzing apparatus according to the present invention. This embodiment of the noise analyzing apparatus employs an embodiment of the noise analyzing method according to the present invention and an embodiment of the computer-readable storage medium according to the present invention. In this embodiment, the present invention is applied to a computer system. FIG. 2 is a perspective view showing the computer system to which the present invention is applied in this embodiment.

A computer system 100 shown in FIG. 2 is generally provided with a main body 101 which includes a CPU, a disk drive and the like, a display 102 which includes a display screen 102a for displaying an image in response to an instruction from the main body 101, a keyboard 103 which is used to input various information to the computer system 100, a mouse 104 which is used to specify an arbitrary position on the display screen 102a of the display 102, and a modem 105 which is used to access an external database or the like and to download programs or the like stored in another computer system.

A noise analyzing program (or a noise analyzing software) which causes the computer system 100 to have a noise analyzing function is stored in a portable recording medium, such as a disk 110, or is downloaded from a recording medium 106 of another computer system using a communication unit such as the modem 105. The computer-readable storage medium according to the present invention is formed by a recording medium, such as the disk 110, which stores the noise analyzing program. The recording medium forming the computer-readable storage medium according to the present invention is not limited to portable recording media such as the disk 110, IC card memory, floppy disk, magneto-optical disk and CD-ROM, but also includes various kinds of recording media which are accessible by a computer system which is coupled via the communication unit or communication means such as the modem 105 and LAN.

Figure 3:
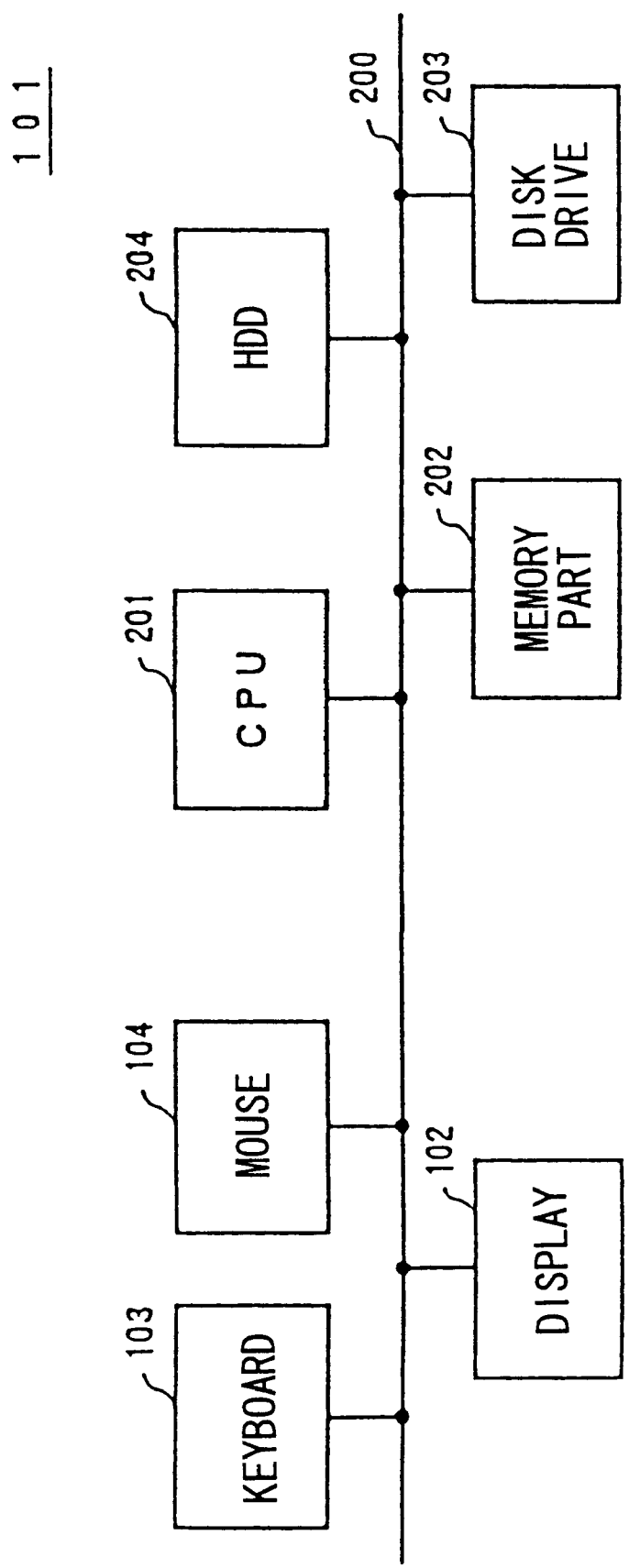
FIG. 3 is a system block diagram for explaining a construction of an important part within a main body of the computer system.

FIG. 3 is a system block diagram for explaining the structure of an important part within the main body 101 of the computer system 100. In FIG. 3, the main body 101 generally includes a CPU 201, a memory part 202 made of RAM, ROM or the like, a disk drive 203 for the disk 110, and a hard disk drive (HDD) 204 which are connected via a bus 200. The display 102, the keyboard 103, the mouse 104 and the like may be connected to the CPU 201 via the bus 200 as shown in FIG. 3 or may be connected directly to the CPU 201. It is also possible to connect the display 102 to the CPU 201 via a known graphic interface (not shown) which carries out an input/output image data processing.

FIG. 3 is a system block diagram for explaining the structure of an important part within the main body 101 of the computer system 100. In FIG. 3, the main body 101 generally includes a CPU 201, a memory part 202 made of RAM, ROM or the like, a disk drive 203 for the disk 110, and a hard disk drive (HDD) 204 which are connected via a bus 200. The display 102, the keyboard 103, the mouse 104 and the like may be connected to the CPU 201 via the bus 200 as shown in FIG. 3 or, connected directly to the CPU 201. It is also possible to connect the display 102 to the CPU 201 via a known graphic interface (not shown) which carries out an input/output image data processing.

Of course, the structure of the computer system 100 is not limited to that shown in FIGS. 2 and 3, and various other known structures may be used instead.

A description will be given of the noise analysis for the case where three bidirectional nets exist, by referring to FIG. 1. As described above, FIG. 1 is a diagram for explaining the noise analysis for the case where three bidirectional nets exist. The noise analysis which is described hereunder may be carried out before the circuit design, during the circuit design, during layout of the circuit elements, during layout of circuit wirings or the like.

In FIG. 1, a bus in the interval C-D and a bus in the interval E-F are selected and specified as one bus group. For example, the selection of the bus and the specifying of the bus group may be made by displaying the nets shown in FIG. 1 on the display 102 and using the keyboard 103 and/or the mouse 104 for the selection of the bus and the specifying of the bus group. More particularly, the selection of the bus and the specifying of the bus group may be made by selecting and grouping buses displayed on the display 102, or by displaying on the display 102 a list of bus names which are assigned to the buses and selecting and grouping the buses in the list. The specified bus group is supplied to the noise analyzing program. Based on the specified bus group, the noise analyzing program analyzes the noise only in the transmitting direction E→F with respect to the transmitting direction C→D. With respect to the transmitting direction D→C, the noise analyzing program analyzes the noise only in the transmitting direction F→E. With respect to the bus between the interval A-B, the noise analyzing program analyzes the noise in both transmitting directions, because the transmitting direction may be the same as that of the bus between the interval C-D or the transmitting direction may be opposite to that of the bus between the interval C-D.

Figure 4:
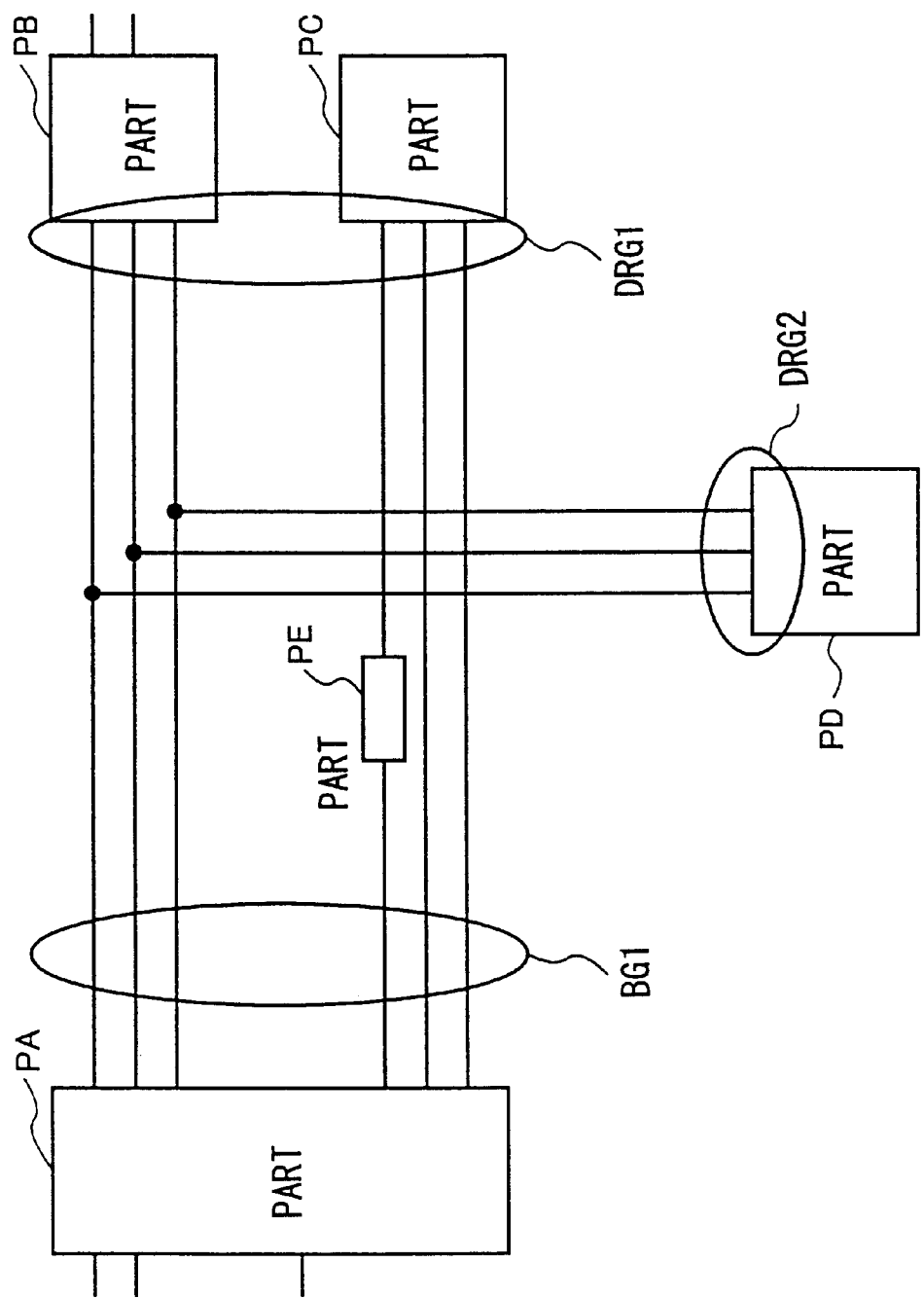
FIG. 4 is a diagram for explaining driver/receiver groups.

Next, a description will be given of the noise analysis for a case where a plurality of pins which become drivers and receivers are connected to one net, by referring to FIG. 4. FIG. 4 is a diagram for explaining driver/receiver groups.

In FIG. 4, if the transmitting directions of the six nets are the same, these six nets are specified as one bus group. In the case shown in FIG. 4, a bus group BG1 is specified, for example. In addition, those nets having drivers formed by pins of other parts are specified in units of parts. In this state, if the transmitting directions of these pins of the other parts are the same, these pins are specified as one driver/receiver group. In the case shown in FIG. 4, a driver/receiver group DRG1 is specified, for example.

When a part PD is selected after selecting a part PB, for example, a message is displayed on the display 102 to indicate that this selection is no permissible, because in one net a pin cannot simultaneously be a pin of a driver. In the case shown in FIG. 4, only a combination of the parts PB and PC or a combination of the parts PD and PC can be specified as the driver/receiver group.

Next, a pin of another driver is specified as a driver/receiver group by another name. In the case shown in FIG. 4, a driver/receiver group DRG2 is specified, for example. However, since only one part PD belongs to the driver/receiver group DRG2, it is possible to omit the specifying of the driver/receiver group DRG2.

The noise analyzing program first analyzes a pin of a part PA which is not specified as a driver/receiver group, as being a driver. The noise analysis is made by assuming that, in the part PA, the transmitting directions are all the same for signals from the pins specified by the bus group. In this state, of the pints of the parts PB, PC and PD, the pints of the bus group BG1 all become receivers.

Next, when the part PB is regarded as a driver, the part PC which also belongs to the same driver/receiver group DRG1 is also regarded as a driver. In this state, of the pints of the parts PA and PD, the pins belonging to the bus group BG1 all become receivers.

A part PE is a damping resistor, for example, and the nets are disconnected at the part PE. However, by registering information which indicates which pins of the damping resistor are connected in a library within the memory part 202, for example, it is possible to track the connection of the nets. In this case, measures are taken so that the pin of the driver and the pin of the receiver are connected.

Figure 5:
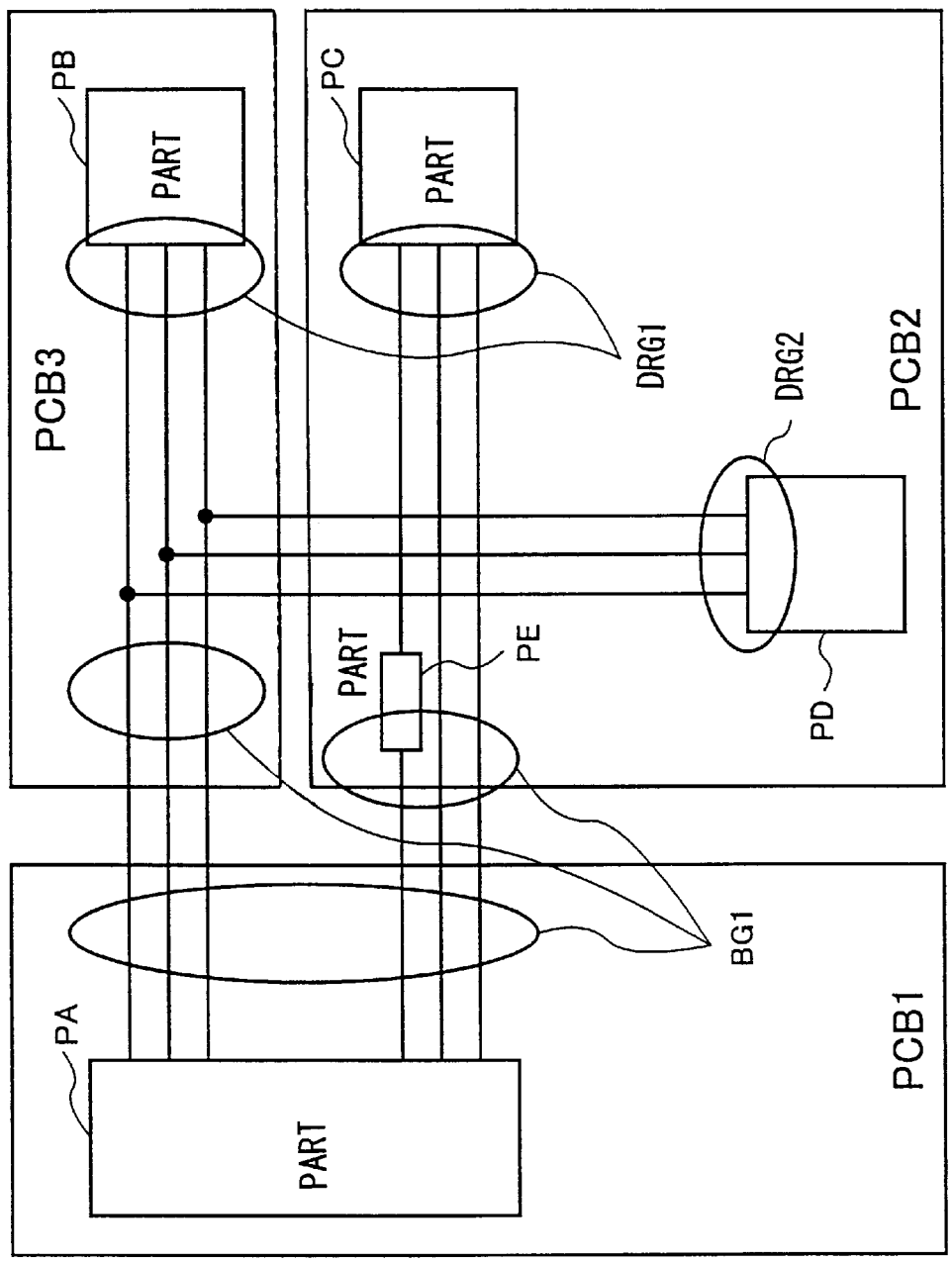

Next, a description will be given of a bus group and driver/receiver groups spanning a plurality of LSIs, PCBs, MCMs and the like, by referring to FIG. 5. FIG. 5 is a diagram for explaining the bus group and the driver/receiver groups spanning the plurality of LSIs, PCBs, MCMs and the like. In FIG. 5, those parts which are the same as those corresponding parts in FIG. 4 are designated by the same reference numerals, and a description thereof will be omitted.

In FIG. 5, the bus group BG1 and the driver/receiver groups DRG1 and DRG2 span a plurality of printed circuit boards (PCBs) PCB1 through PCB3. In this case, the bus group and the driver/receiver group are specified for data of each PCB. When using a tool which simultaneously displays data of a plurality of PCBs, it is possible to simultaneously specify the bus group and the driver/receiver group for a plurality of PCBs. In this case, the bus groups having the same name are treated as one bus group. In addition, the driver/receiver groups having the same name within one bus group are treated as the same driver/receiver group.

For example, when mounting the same PCB on a mother board or mounting the same LSI on the PCB, it is possible to employ the same setting with respect to the same LSI by using the same bus group definition file. In addition, a different bus group definition file is created with respect to each PCB or each LSI, even when the PCBs or LSIs are the same if the PCBs or LSIs belong to different bus groups of different driver/receiver groups.

Figure 6:
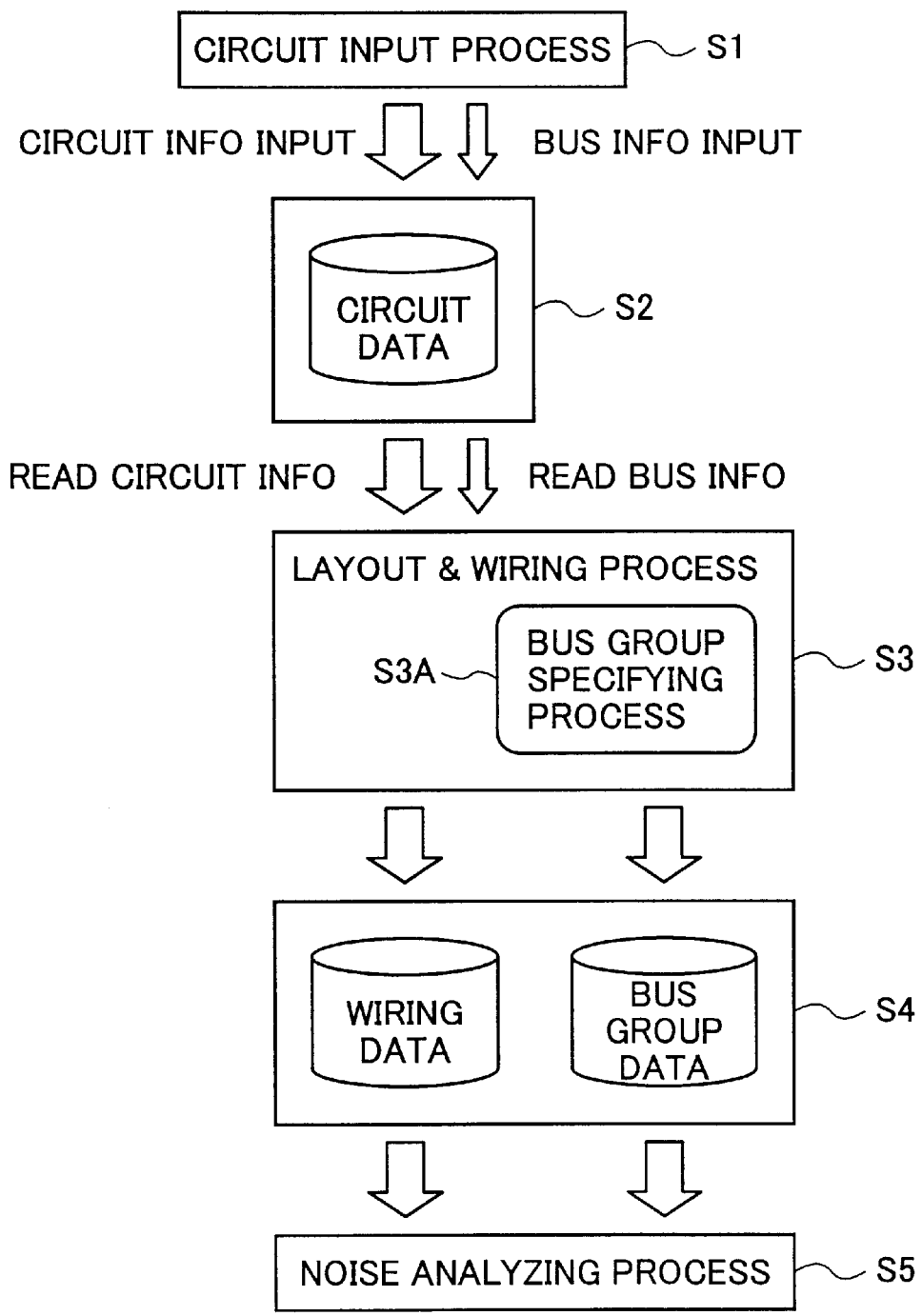
FIG. 6 is a flow chart for explaining a noise analyzing process.

FIG. 6 is a flow chart for explaining a noise analyzing process of the CPU 201 in this embodiment.

In FIG. 6, a step S1 carries out a circuit input process which inputs information related to a circuit which is to be designed. The circuit input process may be carried out by operating the keyboard 103 to input the information, accessing another computer system and reading the information via the modem 105 or, reading the information from a recording medium such as the disk 110 which stores the information. The information related to the circuit which is to be designed includes circuit information and bus information. The circuit information is related to elements and wirings forming the circuit, constants of the elements, layouts of the elements and the wirings, and the like. On the other hand, the bus information relates to the buses. A step S2 stores circuit data, including the circuit information and the bus information, in a storage means such as the memory part 202.

A step S3 carries out a layout and wiring process (or placement and routing process) to arrange the circuit elements and the circuit wirings, based on the circuit information and the bus information stored in the memory part 202. In the step S3, a step S3A carries out a bus group specifying process using the bus information. The bus group specifying process specifies and edits the bus groups, including an addition of the driver/receiver group. When no bus information is input by the circuit input process, the bus group specifying process specifies and edits the bus groups.

A step S4 stores wiring data which are obtained as a result of the layout and wiring process, in a storage means such as the memory part 202, and stores bus group data which are obtained as a result of the bus group specifying process, in a storage means such as the memory part 202. A step S5 carries out a noise analyzing process using the wiring data and the bus group data which are stored in the memory part 202. The noise analyzing process also uses the circuit data stored in the memory part 202 depending on the kind of noise to be analyzed by the noise analyzing process.

Figure 7:
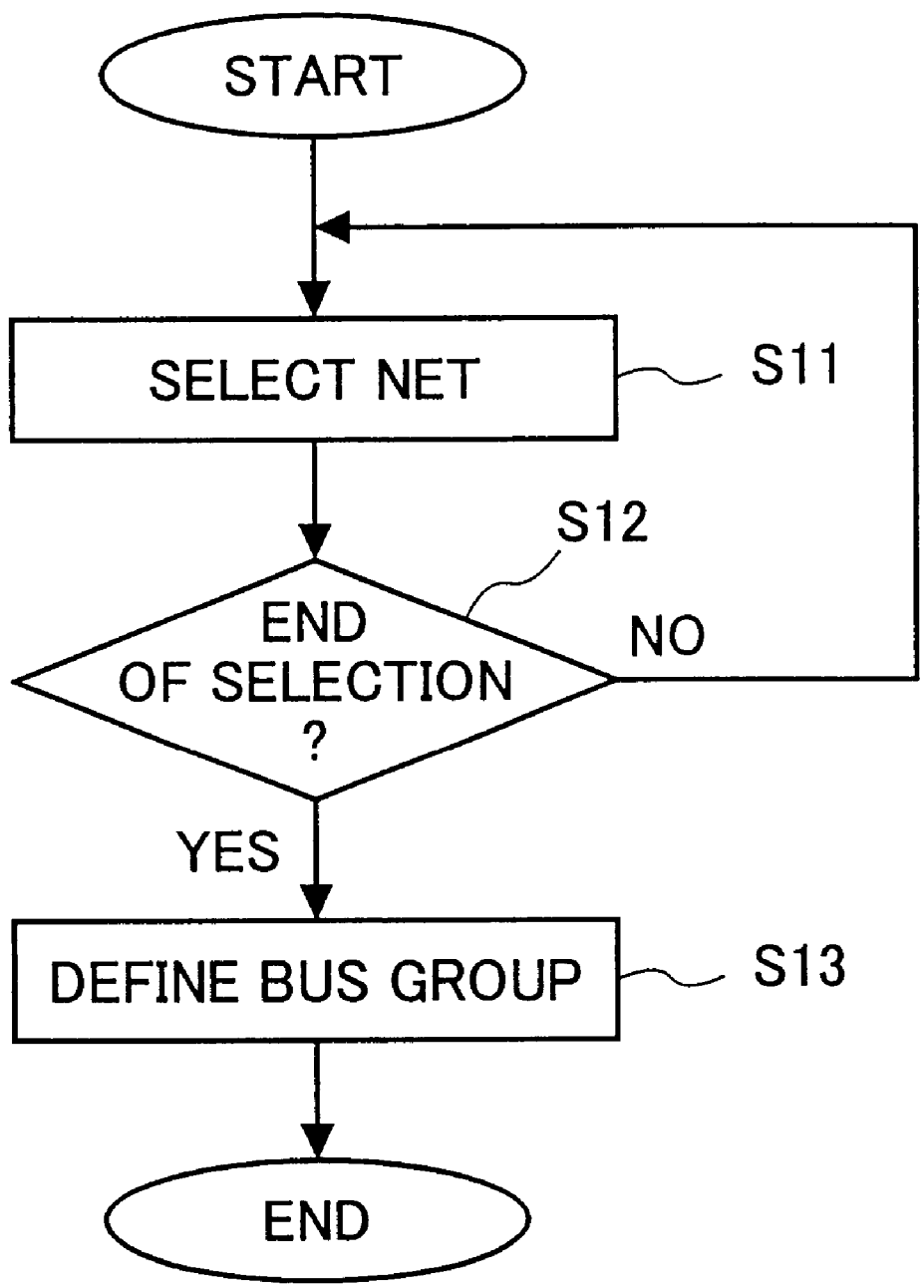
FIG. 7 is a flow chart for explaining a bus group defining process.

FIG. 7 is a flow chart for explaining a bus group defining process. This bus group defining process is included in the bus group specifying process of the step S3A shown in FIG. 6. In FIG. 7, a step S11 selects nets from the circuit which is displayed on the display 102 or, from a net list of the nets forming the circuit and displayed on the display 102, using the keyboard 103 or the mouse 104. A step S12 decides whether the selection of the net has ended, and the process returns to the step S11 if the decision result in the step S12 is NO. On the other hand, if the decision result in the step S12 is YES, a step S13 creates a bus group definition file by selecting and defining the bus groups based on the selected nets, and the process ends. The bus group definition file is stored in the memory part 202, for example.

Figure 8:
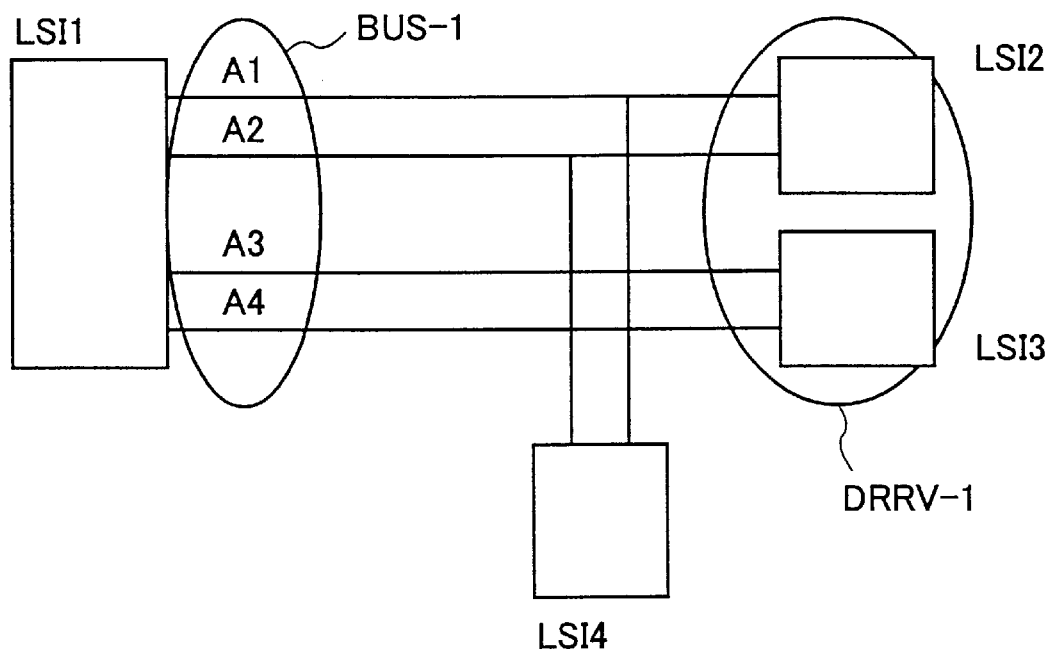
FIG. 8 is a diagram for explaining a bus group definition file.

FIG. 8 is a diagram for explaining the bus group definition file. In a case where the circuit which is to be designed includes parts LSI1 through LSI4, a bus group BUS-1 and a driver/receiver DRRV-1, the bus group definition file becomes as follows.

```
HEAD;
  PCBNAME pcb-1;
    BUS_GROUP BUS-1;
      NETNAME A1 A2 A3 A4;
      DR_RV_GROUP DRRV-1;
        LOCATION LSI2 LSI3;
    END;
END;
```

Figure 9:
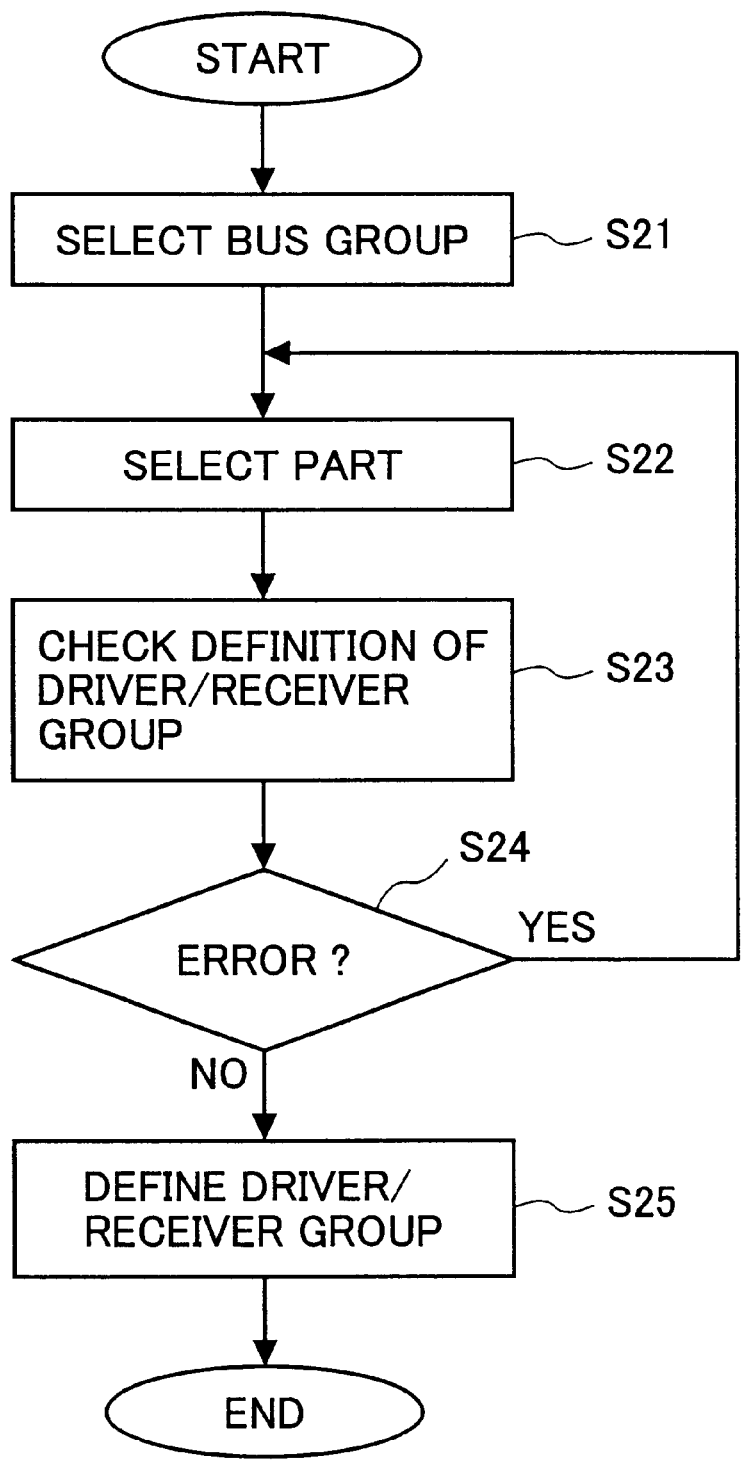
FIG. 9 is a flow chart for explaining a driver/receiver group defining process.

FIG. 9 is a flow chart for explaining a driver/receiver group defining process. This driver/receiver group defining process is included in the bus group specifying process of the step S3A shown in FIG. 6. In FIG. 9, a step S21 specifies buses from the circuit which is displayed on the display 102 or, from a bus list of the buses forming the circuit and displayed on the display 102, using the keyboard 103 or the mouse 104, so as to select a bus group. A step S22 selects parts from the circuit which is displayed on the display 102 or, from a parts list of the parts forming the circuit and displayed on the display 102, using the keyboard 103 or the mouse 104. A step S23 checks a definition of the driver/receiver group. A step S24 decides whether or not an error exists in the definition of the driver/receiver group. If an error such as the transmitting direction being different from the other drivers/receivers exists in the definition of the driver/receiver group, the decision result in the step S24 is YES, and the process returns to the step S22. On the other hand, if the decision result in the step S24 is NO, a step S25 creates a driver/receiver group definition file which defines the driver/receiver group, and the process ends. The driver/receiver group definition file is stored in the memory part 202, for example. The driver/receiver group definition file may be provided within the bus group definition file.

Figure 10:
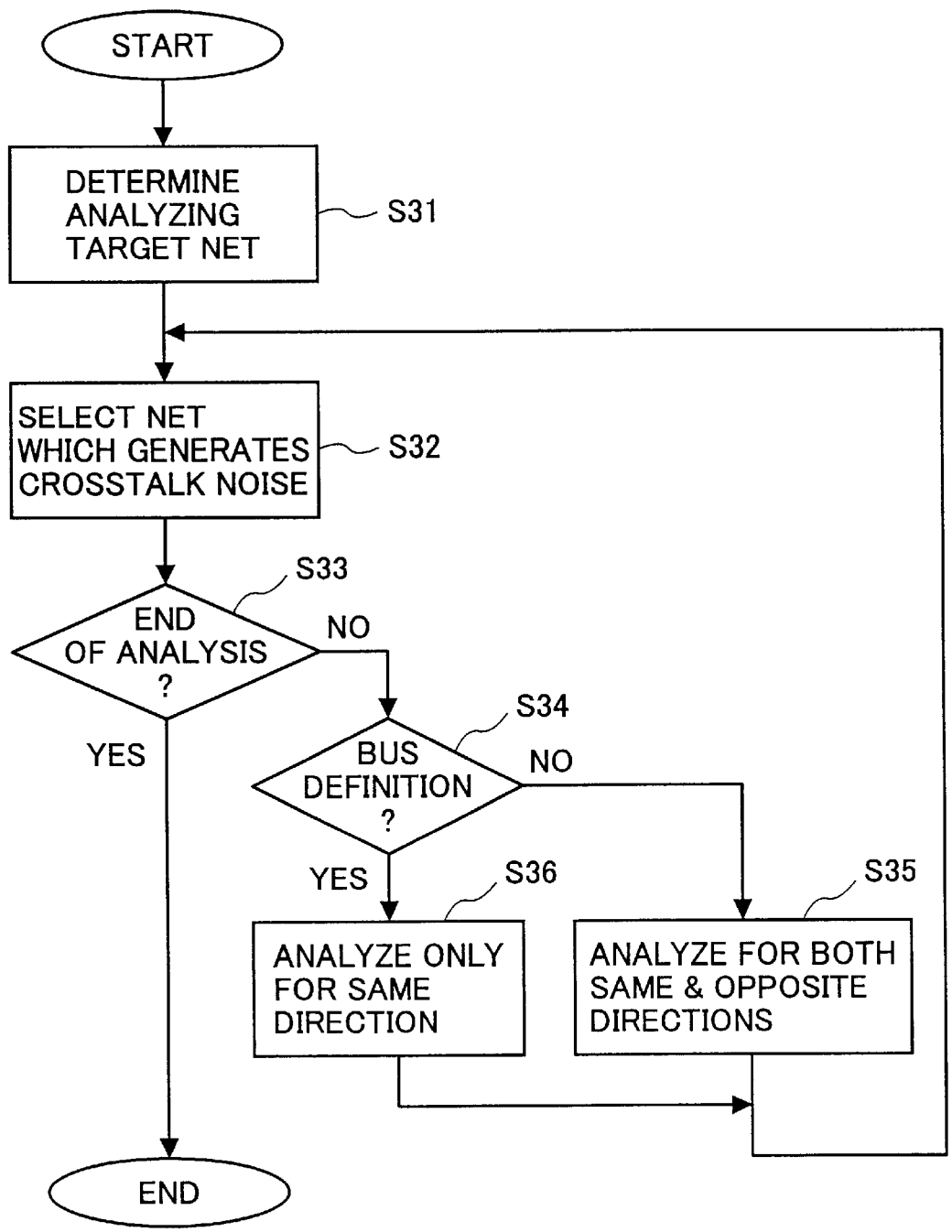
FIG. 10 is a flow chart for explaining a noise analyzing process.

FIG. 10 is a flow chart for explaining the noise analyzing process. This noise analyzing process is carried out in the step S5 shown in FIG. 6. In FIG. 10, a step S31 determines an analyzing target net which is the target of the analysis. The analyzing target net may be determined by selecting a net from the circuit which is displayed on the display 102 or, from the net list of the nets forming the circuit and displayed on the display 102, using the keyboard 103 or the mouse 104. A step S32 selects a net which generates a crosstalk with respect to the determined analyzing target net, similarly as in the step S31, by use of the keyboard 103 or the mouse 104. A step S33 decides whether or not the analysis of all of the analyzing target nets has ended, and the process ends if the decision result in the step S33 is YES.

On the other hand, if the decision result in the step S33 is NO, a step S34 decides whether or not a bus definition exists in the circuit data. In other words, the step S34 decides whether or not a bus group definition file exists. If the decision result in the step S34 is NO, a step S35 carries out a noise analysis in the same transmitting direction and in the opposite transmitting direction, with respect to the bus of the analyzing target net, according to a known method, and the process returns to the step S32. If the decision result in the step S34 is YES, a step S36 carries out a noise analysis only in the same transmitting direction, with respect to the bus of the analyzing target net, based on the bus group definition file and the driver/receiver group definition file, according to a known method. The process returns to the step S32 after the step S36. Accordingly, the step S36 does not carry out the noise analysis with respect to combinations of the transmitting directions which actually do not exist. As a result, it is possible to reduce the analyzing time. It is also possible to prevent an analysis result, which indicates a noise larger than the crosstalk noise which will actually be generated, from being estimated erroneously.

Figure 11:
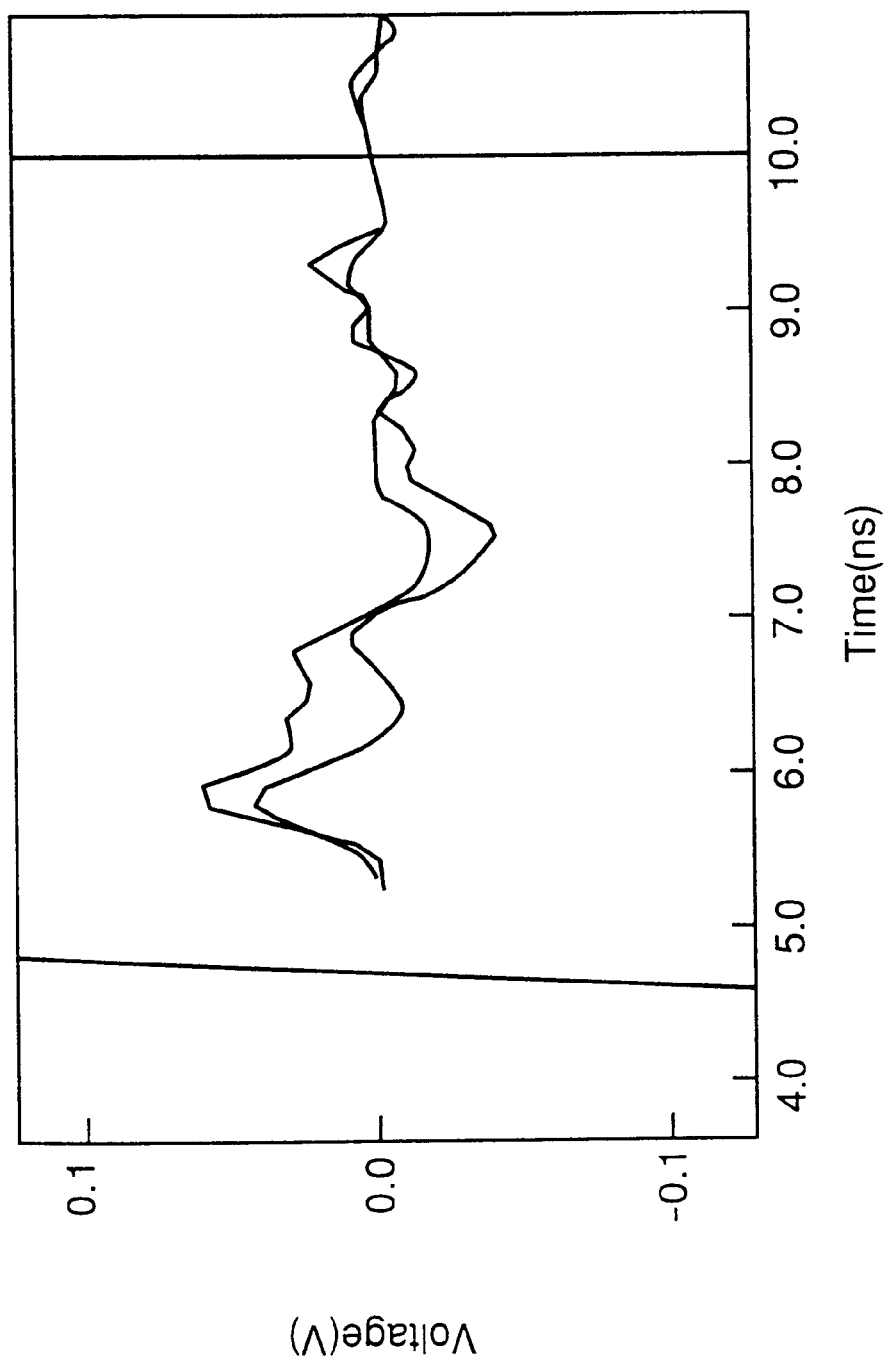
FIG. 11 is a diagram showing a crosstalk noise waveform for a case where no bus group definition is made.

FIG. 11 is a diagram showing a crosstalk noise waveform for a case where no bus group definition is made. In FIG. 11, the ordinate indicates the voltage (V), and the abscissa indicates the time (ns). The crosstalk noise waveform shown in FIG. 11 was obtained by carrying out the noise analysis, with respect to the noise analyzing target nets shown in FIG. 1, in both the same transmitting direction and the opposite transmitting direction in the step S35 shown in FIG. 10. As may be seen from FIG. 11, the crosstalk noise from the adjacent net is 59 mV at the maximum.

Figure 12:
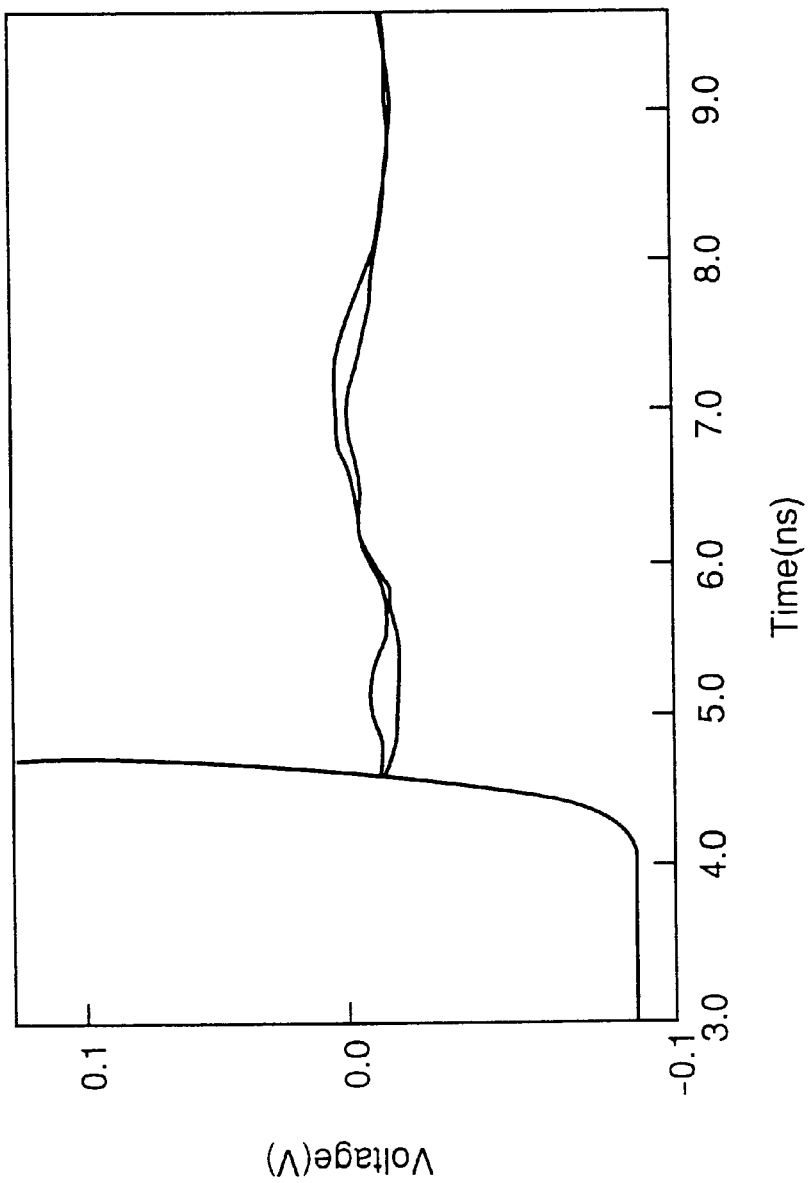
FIG. 12 is a diagram showing a crosstalk noise waveform for a case where a bus group definition is made.

FIG. 12 is a diagram showing a crosstalk noise waveform for a case where the bus group definition is made. In FIG. 12, the ordinate indicates the voltage (V), and the abscissa indicates the time (ns). The crosstalk noise waveform shown in FIG. 12 was obtained by carrying out the noise analysis, with respect to the noise analyzing target nets shown in FIG. 1, in only the same transmitting direction in the step S36 shown in FIG. 10. As may be seen from FIG. 12, the crosstalk noise from the adjacent net is 17 mV at the maximum.

In the case of the buses in which the signal transmitting directions are the same, it is unnecessary to consider the signal flow in the opposite transmitting direction. Because the crosstalk noise caused by the signal flow in the opposite transmitting direction is large compared to the crosstalk noise caused by the signal flow in the same transmitting direction, the crosstalk noise which is estimated by the noise analysis becomes considerably larger than the crosstalk noise which is actually generated if the crosstalk noise caused by the signal flow in the opposite transmitting direction is taken into consideration. But as may be seen from a comparison of FIGS. 12 and 11, this embodiment can accurately estimate the crosstalk noise by carrying out the noise analysis only for the same transmitting direction in a case where it is unnecessary to consider the signal flow in the opposite transmitting direction.

When linking the noise analysis with a conceptual design system or a circuit entry system, a process similar to that of the embodiment described above may be carried out based on virtual wiring data.

Further, the present invention is not limited to these embodiments, but various variations and modifications may be made without departing from the scope of the present invention.

What is claimed is:

1. A noise analyzing method comprising:
    analyzing a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction;
    grouping the buses having the same signal transmitting direction into a bus group which is managed as a bus group definition file; and
    said bus group definition file including a driver/receiver group in which parts having the same signal transmitting direction are grouped as a driver/receiver group.

2. The noise analyzing method as claimed in claim 1, further comprising:
    regarding nets which are to be connected as belonging to the same bus group and the same driver/receiver group when analyzing a noise spanning a plurality of circuit parts.

3. The noise analyzing method as claimed in claim 2, further comprising:
    specifying the buses having the same signal transmitting direction.

4. The noise analyzing method as claimed in claim 1, further comprising:
    specifying the buses having the same signal transmitting direction.

5. A noise analyzing apparatus comprising:
    an analyzing section analyzing a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction;
    a managing section grouping the buses having the same signal transmitting direction into a bus group which is managed as a bus group definition file; and
    said bus group definition file including a driver/receiver group in which parts having the same signal transmitting direction are grouped as a driver/receiver group.

6. The noise analyzing apparatus as claimed in claim 5, wherein said analyzing section regards nets which are to be connected as belonging to the same bus group and the same driver/receiver group when analyzing a noise spanning a plurality of circuit parts.

7. The noise analyzing apparatus as claimed in claim 6, further comprising:
    an input device specifying the buses having the same signal transmitting direction.

8. A computer-readable storage medium which stores a program for causing a computer to carry out a noise analyzing process, by:
    causing the computer to analyze a crosstalk noise based on circuit data in which buses having the same signal transmitting direction and buses having opposite signal transmitting directions are distinguished from each other, by analyzing the crosstalk noise only for the same signal transmitting direction with respect to the buses having the same signal transmitting direction; and
    causing the computer to group the buses having the same signal transmitting direction into a bus group which is managed as a bus group definition file, said bus group definition file including a driver/receiver group in which parts having the same signal transmitting direction are grouped as a driver/receiver group.

9. The computer-readable storage medium as claimed in claim 8, wherein said program further comprises:
    causing the computer to regard nets which are to be connected as belonging to the same bus group and the same driver/receiver group when analyzing a noise spanning a plurality of circuit parts.

10. The computer-readable storage medium as claimed in claim 9, wherein said program further comprises:
    causing the computer to specify the buses having the same signal transmitting direction in response to an input.

11. The noise analyzing apparatus as claimed in claim 5, further comprising:
    an input device specifying the buses having the same signal transmitting direction.

12. The computer-readable storage medium as claimed in claim 8, wherein said program further comprises:
    causing the computer to specify the buses having the same signal transmitting direction in response to an input.

13. A computer-readable storage storing a program causing a computer to carry out a noise analyzing process, by:
    based on circuit data in which buses having the same signal transmitting direction and buses having opposite signal transmitting directions are distinguished from each other, analyzing the crosstalk noise only for the same signal transmitting direction with respect to the buses having the same signal transmitting direction; and
    grouping the buses having the same signal transmitting direction into a bus group which is managed as a bus group definition file, the bus group definition file including a driver/receiver group in which parts having the same signal transmitting direction are grouped as a driver/receiver group.

14. The computer-readable storage as claimed in claim 13, wherein the program causes the computer to carry out the noise analyzing process, further, by:
    regarding nets, which are to be connected as belonging to the same bus group and the same driver/receiver group, when analyzing a noise spanning a plurality of circuit parts.

15. The computer-readable storage as claimed in claim 14, wherein the program causes the computer to carry out the noise analyzing process, further, by:
    specifying the buses having the same signal transmitting direction in response to an input.

* * * * *